(12) United States Patent
Motz

(10) Patent No.: US 11,716,060 B2
(45) Date of Patent: Aug. 1, 2023

(54) AMPLIFIER CIRCUITS AND METHOD FOR OPERATING AMPLIFIER CIRCUITS

(71) Applicant: Infineon Technologies AG, Neubiberg (DE)

(72) Inventor: Mario Motz, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/654,739

(22) Filed: Mar. 14, 2022

(65) Prior Publication Data

US 2022/0321070 A1 Oct. 6, 2022

(30) Foreign Application Priority Data

Mar. 31, 2021 (DE) .......................... 102021108214.5

(51) Int. Cl.
*H03F 3/393* (2006.01)
*G01D 5/14* (2006.01)
*G01B 7/30* (2006.01)

(52) U.S. Cl.
CPC ............... *H03F 3/393* (2013.01); *G01B 7/30* (2013.01); *G01D 5/145* (2013.01)

(58) Field of Classification Search
CPC . H03F 3/38; H03F 3/387; H03F 3/393; H03F 3/45475; H03F 3/45968; G01B 7/30; G01D 5/14; G01D 5/142; G01D 5/145
See application file for complete search history.

(56) References Cited

U.S. PATENT DOCUMENTS

| | | | | |
|---|---|---|---|---|
| 2014/0077873 A1* | 3/2014 | Motz | .................. | H03F 3/45977 330/9 |
| 2016/0294331 A1* | 10/2016 | Ivanov | ................ | H03F 3/45753 |
| 2019/0158034 A1* | 5/2019 | Sloboda | .................. | H03F 1/26 |

FOREIGN PATENT DOCUMENTS

| | | |
|---|---|---|
| DE | 10119519 A1 | 11/2002 |
| EP | 2797230 B1 | 3/2019 |

* cited by examiner

*Primary Examiner* — Huy Q Phan
*Assistant Examiner* — David B Frederiksen
(74) *Attorney, Agent, or Firm* — Harrity & Harrity, LLP

(57) ABSTRACT

The present disclosure relates to chopper amplifier circuits with inherent chopper ripple suppression. Example implementations can realize a doubly utilized chopper amplifier circuit that is a current-saving circuit with a wake-up function that is capable of providing a self-wake signal in order to change into a fast, low-jitter/low-latency mode, and to provide a wake-up signal for a sleeping microprocessor or a system in response to signal changes.

20 Claims, 12 Drawing Sheets

AMPLIFIER CIRCUITS AND METHOD FOR OPERATING AMPLIFIER CIRCUITS

CROSS REFERENCE TO RELATED APPLICATION

This application claims priority to German Patent Application No. 102021108214.5, filed on Mar. 31, 2021, the contents of which are incorporated by reference herein in their entirety.

TECHNICAL FIELD

The present disclosure relates generally to circuits and methods for amplifiers and, in particular, circuits and methods for reducing chopper ripples in chopper amplifier circuits.

BACKGROUND

Chopper amplifiers, also referred to below as chopper amplifier circuits, are a type of amplifier in which a signal to be amplified is modulated (chopped), amplified and then demodulated again. Through the use of this type of technology, a zero-point error (or offset error) and what is known as 1/f noise of an amplifier can be shifted into an uninteresting frequency band. Chopper amplifiers of this type can, for example, be used in bandgap circuits that provide a defined reference voltage but that can also, however, be used in other applications in which a signal is to be amplified such as, for example, the amplification of measurement signals.

SUMMARY

According to a first aspect of the present disclosure, an amplifier circuit is proposed that can also be referred to as a chopper amplifier circuit. The amplifier circuit comprises a modulator circuit that is switched at a chopper frequency and that is configured to convert a DC (direct current) input voltage into an AC (alternating current) input voltage in accordance with the chopper frequency. The amplifier circuit further comprises an amplifier with an inverting input and with a non-inverting input for the AC input voltage, as well as with an inverting output and a non-inverting output for an amplified AC input voltage. The inverting output of the amplifier is coupled to an input terminal of a first capacitor. The non-inverting output of the amplifier is coupled to an input terminal of a second capacitor.

The DC input voltage, or the amplified DC input voltage, can each be direct voltages. However, in comparison with the chopper frequency, only slowly changing signals can at all be expected, so that the input voltage, or the amplified DC input voltage, can be considered effectively to be direct voltages during one switching phase.

The amplifier can, for example, comprise a simple single-loop amplifier, an operational amplifier, an instrumentation amplifier, a comparator, or an ADC input.

According to some example implementations, the amplifier circuit can be operated in a first operating mode and in a second operating mode. The first operating mode can be an energy-saving mode in which the input voltage is sampled non-continuously in time, whereas the second operating mode can be a normal mode in which the input voltage is processed continuously in time.

In a first switching phase of the modulator circuit in the first operating mode, an output terminal of the first capacitor and an output terminal of the second capacitor are connected to a joint common-mode potential, or DC potential. As a result, the (amplified) input voltage can be stored on the capacitors. In a second switching phase of the modulator circuit in the first operating mode, the output terminal of the first capacitor is coupled to a first input of an output amplifier (comparator, for example), and the output terminal of the second capacitor is coupled to a second input of the output amplifier. A sampled value of the input voltage from which an offset has been removed can thus be provided at the output amplifier.

In the second operating mode, a discharge resistor circuit is coupled between the output terminals of the first and second capacitors, through which a charge equalization can take place between the capacitors during a pair of sequential switching phases. The output terminals of the first and second capacitors are coupled to the output amplifier via a demodulator circuit switchable at the chopper frequency. The demodulator circuit is configured to convert the amplified AC voltage back into an amplified DC voltage.

In the first operating mode, the amplifier circuit can be operated in an energy-saving, switched-capacitor mode, in which amplifier output signals (including offset voltages of a signal source and/or of the amplifier) are sampled using the capacitors in the first switching phase. In the second switching phase of the first operating mode, an output signal from which offset has been removed can be provided at the output amplifier output by reversing the polarity of the amplifier inputs. This output signal from which offset has been removed can serve as a basis for deciding whether the amplifier circuit should continue to operate in the first operating mode or change into the second operating mode.

In the second operating mode, the amplifier circuit can be operated in a normal mode, continuous in time. Due to the discharge resistor circuit, a chopper ripple present at the output of the amplifier circuit in the second operating mode can be reduced in comparison with a conventional chopper amplifier circuit. Offset voltages that have been amplified by the amplifier and demodulated by the demodulator circuit are referred to as chopper ripple. A conventional demodulation of an offset DC voltage then results in an unwanted alternating voltage (chopper ripple). Due to the coupling of the first and second capacitors via the discharge resistor circuit, the DC component of a differential voltage between the non-inverting and inverting signal paths can be reduced, and the chopper ripple thereby also reduced.

According to some example implementations, the first and second switching phases constitute a switching cycle. The amplifier circuit can be configured to switch off a current consumption, at least of the amplifier, for a sleep time period in the first operating mode between the second switching phase of one switching cycle and a first switching phase of a subsequent switching cycle. The first operating mode can thereby be an energy-saving mode. It will be clear to the expert that, in addition to the amplifier, further current consumers can be switched off during the sleep time period in order to reduce the current consumption of the amplifier circuit further. For example, a single-ended signal transducer (sensor) for the input voltage can also be switched off during the sleep time period.

According to some example implementations, the output terminals of the first and second capacitors are disconnected from the inputs of the output amplifier during the first switching phase of the first operating mode. The inverting and non-inverting output signals of the first switching phase can thus each be stored temporarily on the first and second capacitors.

According to some example implementations, a ratio between the sleep time period and a duration of the switching cycle lies in a range between 10-10,000. The greater the ratio between the sleep time period and the switching cycle, the more energy can be saved in the first operating mode (energy saving mode).

According to some example implementations, the amplifier circuit is configured in the first operating mode to compare a first output signal of the output amplifier from the second switching phase of a switching cycle to a second output signal of the output amplifier from the second switching phase of a subsequent switching cycle. In the event of a change in the arithmetic sign between the first and second output signal, a change can be made from the first operating mode (sampling mode or energy-saving mode) into the second (time-continuous) operating mode. This change in the operating mode can also be referred to as a wake-up, and may be of interest, for example, for magnetic quadrant or rotation counters. A change in the arithmetic sign between the first and second output signal can, for example, indicate that a quadrant change is taking place in a rotating magnetic field. In this case it is possible to change into the second operating mode in order to measure the rotating magnetic field in a time-continuous manner.

According to some example implementations, a resistance value of the discharge resistor circuit (in the second operating mode) lies in a range such that a time constant of the first or second capacitor together with the discharge resistor circuit lies in a range between $10/f_{chop}$ and $200/f_{chop}$, wherein $f_{chop}$ indicates the chopping frequency. Resistances of the discharge resistor circuit can thus be configured with a high resistance value in order to achieve a long discharge time period.

According to some example implementations, the discharge resistor circuit comprises a first discharge resistor arrangement coupled between an output terminal of the first capacitor and a reference potential, and a second discharge resistor arrangement coupled between an output terminal of the second capacitor and the reference potential. The reference potential can, for example, be a common mode or DC potential.

According to some example implementations, the discharge resistor circuit comprises a switch arrangement that is configured to connect the first discharge resistor arrangement between the first capacitor and the reference potential, and to connect the second discharge resistor arrangement between the second capacitor and the reference potential, during a discharge time period. A discharge of the capacitors can thus deliberately be made to take place during discharge time periods. According to some example implementations, the discharge time period corresponds to a time period between a first and a second switching phase of the modulator circuit.

According to some example implementations, the switch arrangement is operated in a clocked manner, so that discharge time periods lie between a first and a second switching phase of the modulator circuit. A clock rate of the discharge resistor circuit can here be synchronous with the chopper frequency, or can be generated pseudo-randomly. Intermodulation effects with an input signal can be reduced even further in this way.

According to some example implementations, a duty cycle of the switch arrangement lies in a range between 0.1%-5%.

According to some example implementations, the discharge resistor circuit can comprise one or a plurality of switched capacitors. Using switched capacitors, resistors can be realized according to $R=1/f_sC$, where $f_s$ represents the switching frequency of a switched capacitor. Capacitors, in comparison with resistors of integrated circuits, can be manufactured more accurately, and high resistance values can be realized with small capacitances.

According to some example implementations, the discharge resistor circuit can comprise one or a plurality of voltage-controlled pseudo-resistors comprising switched MOS transistors connected in series. Pseudo-resistors can use MOS components connected with diodes which operate in the sub-threshold range and which use less surface area than the corresponding discrete component.

According to some example implementations, a first output of the modulator circuit is directly connected to the inverting input of the amplifier, and a second output of the modulator circuit is directly connected to the non-inverting input of the amplifier. According to some example implementations, a non-inverting input of the modulator circuit is, in addition or alternatively, connected directly to a signal source, and an inverting input of the modulator circuit is connected directly to the signal source. An input signal can thus be connected directly to the modulator circuit. The amplifier input can also be connected directly to the output of the modulator circuit. Potentially large input capacitors can be omitted thanks to the proposed demodulator circuit.

According to some example implementations, the amplifier circuit further comprises a third-order or lower low-pass or band-stop filter circuit connected to the demodulator circuit on the output side. This makes it possible to filter out the remaining residual ripples at the chopper frequency $f_{chop}$ accurately. This type of filter is also known under the name of double-T-filter, since an R-C-R network is arranged on the one path and a C-R-C network on the parallel path in the form of a T. A specific frequency is thereby filtered out very selectively, in this preferably in this case $f_{chop}$. As a result of the proposed advantageous design of the demodulator circuit, even low-pass filter circuits of low order are sufficient to suppress the remaining chopper ripple pulses (voltage peaks) adequately.

According to some example implementations, the amplifier circuit further comprises a Hall sensor configured for spinning current operation, to provide the input voltage (Hall voltage) for the modulator circuit.

According to some example implementations, the first switching phase of the (de)modulator circuit corresponds to a first spinning phase of the Hall sensor, and the second switching phase of the (de)modulator circuit corresponds to a second spinning phase of the Hall sensor. Expressed in different words, the spinning phases can be synchronous with the switching phases of the (de)modulator circuit.

An angle sensor is proposed in accordance with a further aspect of the present disclosure. The angle sensor comprises a first amplifier circuit according to the present disclosure. The angle sensor also comprises a second amplifier circuit according to the present disclosure. The angle sensor comprises a first Hall sensor configured for spinning current operation, to provide the input voltage for the first amplifier circuit. The first Hall sensor is sensitive to a first magnetic field direction. The angle sensor comprises a second Hall sensor configured for spinning current operation, to provide the input voltage for the second amplifier circuit. The second Hall sensor is sensitive to a second magnetic field direction (perpendicular to the first magnetic field direction). The first amplifier circuit is configured in the first operating mode to compare a first output signal of its output amplifier from the second switching phase of a switching cycle to a second output signal of its output amplifier from the second switching phase of a subsequent switching cycle to obtain a first comparison signal. The second amplifier circuit is configured in the first operating mode to compare a first output signal of its output amplifier from the second switching phase of the switching cycle to a second output signal of its output amplifier from the second switching phase of the subsequent switching cycle to obtain a second comparison signal. In the event that the first and/or the second comparison signal demonstrates a change in the arithmetic sign between the respective first and second output signals, the angle sensor is configured to change the first operating mode into the second operating mode.

According to a further aspect of the present disclosure, a method is proposed for the operation of an amplifier circuit that comprises a modulator circuit switchable at a chopper frequency in order to convert a DC input voltage into an AC voltage in accordance with the chopper frequency, an amplifier with an inverting input and a non-inverting input for the AC voltage and with an inverting output and a non-inverting output for an amplified AC voltage, wherein the inverting output of the amplifier is coupled to an input terminal of a first capacitor and the non-inverting output of the amplifier is coupled to an input terminal of a second capacitor. In a first operating mode of the amplifier circuit, the method comprises: switching an output terminal of the first capacitor and an output terminal of the second capacitor to a common DC potential during a first switching phase of the modulator circuit; coupling the output terminal of the first capacitor to a first input of an output amplifier, and coupling the output terminal of the second capacitor to a second input of the output amplifier during a second switching phase of the modulator circuit.

In a second operating mode of the amplifier circuit, the method comprises: switching a discharge resistor circuit between the output terminals of the first and second capacitors; coupling the output terminals of the first and second capacitors via a demodulator circuit switchable at the chopper frequency to the output amplifier in order to convert the amplified AC voltage into an amplified DC voltage.

Using an input modulator, an amplifier, (AC coupled) output capacitors connected directly between the amplifier output and the demodulator, and a duty-cycled resistor or switched-capacitor resistor or pseudo-resistor with MOS transistors connected in the reverse-bias direction, that are operated in what is known as deep weak inversion, to realize very high-value resistors on a small area in order to achieve a very slow charge equalization (in comparison with the chopper frequency). Chopper ripple suppression can in this way be achieved in the second operating mode. An offset-compensated chopper amplifier with low chopper ripple noise, low jitter, low signal delay (latency) and low chip area can thus be provided.

In the first operating mode, the amplifier circuit can be used in switched-capacitor operation for energy-saving sampling of the input voltage at predefined intervals. Upon detection of a change in arithmetic sign of the input voltage, it is possible to change into the time-continuous second operating mode and/or for a wake-up signal to be generated at the same time in order, for example, to wake up an external microprocessor.

BRIEF DESCRIPTION OF THE DRAWINGS

Some examples of apparatuses and/or methods are explained, purely by way of example, in more detail below with reference to the appended figures. In the figures:

FIG. 2 shows an illustration of alternating chopper switching phases with discharge time periods lying between;

DETAILED DESCRIPTION

Some examples will now be explained extensively with reference to the appended figures. Further possible examples are not, however, restricted to the features of these implementations described in detail. These can exhibit modifications of the features, as well as correspondences and alternatives to the features. The terminology that is used here for the description of specific examples should not, furthermore, be restrictive for further possible examples.

Identical or similar reference signs in the full description of the figures relate to identical or similar elements or features, each of which can be implemented in an identical or modified form while providing the same or a similar function. The thicknesses of lines, layers and/or regions in the figures can, furthermore, be exaggerated for clarity.

If two elements A and B are combined using the term "or", this is to be understood that all the possible combinations are disclosed, e.g. only A, only B, and A and B, unless this is explicitly defined otherwise in individual cases. "At least one of A and B" or "A and/or B" may be used as alternative formulations of the same combinations. Equivalent considerations apply to combinations of more than two elements.

If a singular form such as "a" and "the" is used, and if the use of only one single element is not defined either explicitly or implicitly as obligatory, further examples can also use multiple elements to implement the same function. If a function is described below as being implemented through the use of multiple elements, further examples can implement the same function using a single element or a single processing entity. It is further understood that when the terms "includes", "including", "comprises" and/or "comprising" are used they describe the presence of the stated features, whole numbers, steps, operations, processes, elements, components and/or a group of the same, but do not, however, exclude the presence or addition of one or a plurality of other features, whole numbers, steps, operations, processes, elements, components and/or a group of the same.

The modulation and demodulation, also referred to as chopping, performed by a chopper amplifier may cause ripples in the output signal (referred to herein as ripples or chopper ripples). Such ripples can, for example, be caused by a voltage offset in an amplifier that is used for amplification in the chopper amplifier. The amplitude of the ripple corresponds to the offset, and the frequency of the ripple corresponds to the chopper frequency.

Various techniques have been used to reduce such ripples. In at least some cases such conventional techniques are expensive to implement, and are disadvantageous in terms of the current consumption, or are limited to a specific chopper frequency.

Some implementations described herein provide improved techniques to reduce chopper ripples.

Figure 1:
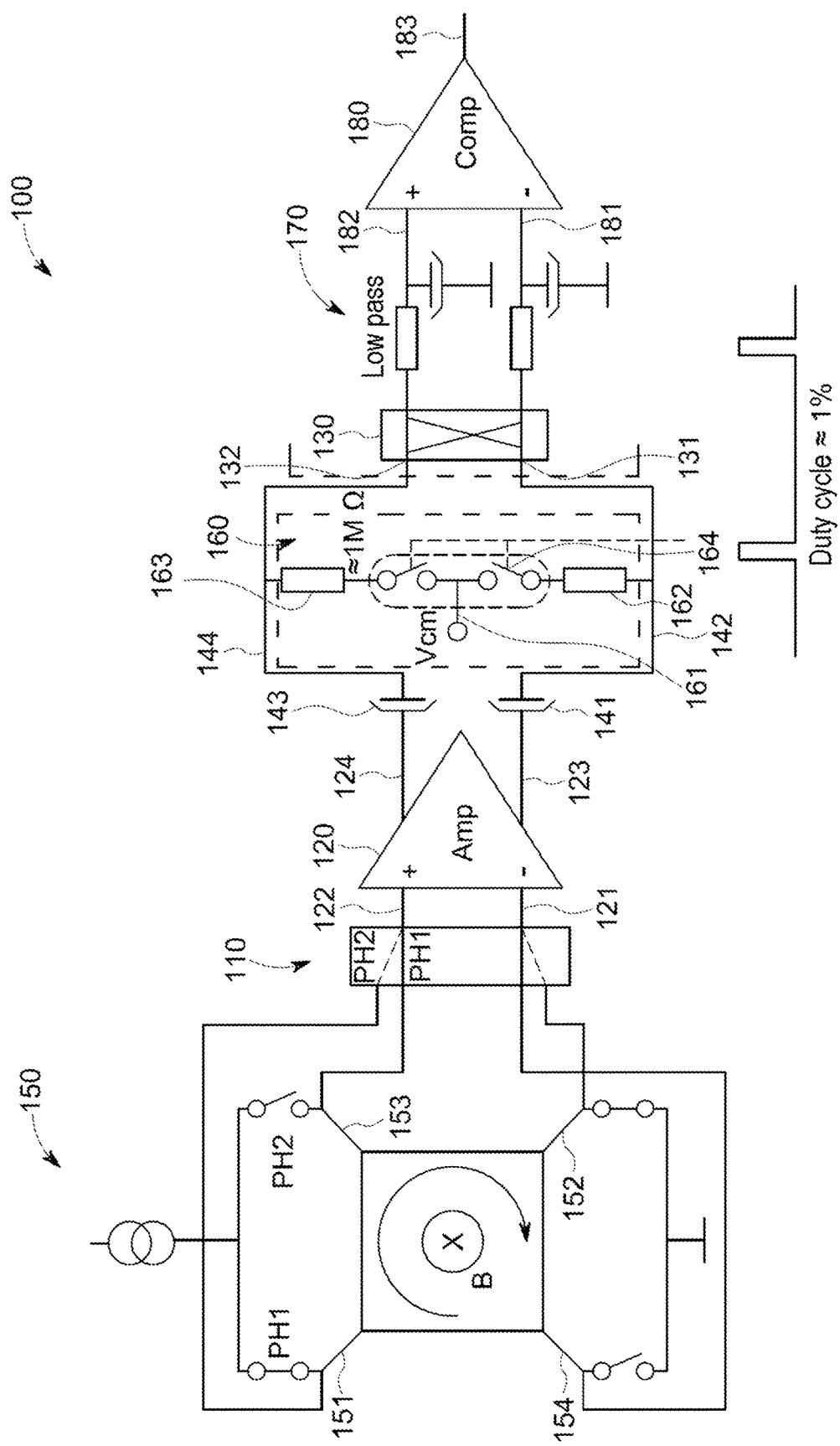
FIG. 1 shows the fundamental concept of an amplifier in normal mode according to one example implementation of the present disclosure, with inherent chopper ripple suppression, combined with a rotating Hall sensor.

FIG. 1 shows an amplifier circuit 100 according to a first example implementation of the present disclosure. The amplifier circuit 100 can operate in a time-continuous mode in order to provide an offset-free output signal. This time-continuous mode is also referred to below as the "normal mode".

The amplifier circuit 100 comprises a modulator circuit 110 clocked at a chopper frequency $f_{chop}$. The modulator circuit 110 is configured to convert a DC input voltage originating from a signal source 150 into an AC input voltage. The DC input voltage can approximately be assumed to be approximately constant during a switching phase (chopper phase) PH1 or PH2 of the modulator circuit 110. The DC input voltage can, however, also change in the course of time, but at a frequency that is significantly lower than the chopper frequency $f_{chop}$. In the illustrated example implementation, the signal source 150 is configured as a Hall sensor that can be operated in what is known as spinning current operation. Offsets in Hall sensors can be reduced by the three-phase method or the spinning current method, in which an initial voltage current of a Hall sensor is rotated spatially around the hall sensor while the output is averaged over time. This reduces an offset and an offset drift.

During a first spinning or chopper switching phase PH1, a first current flows via the terminals 151, 152, so that a first Hall voltage can be accessed at the terminals 153, 154. During a subsequent second spinning or chopper switching phase PH2, a second current flows via the terminals 153, 154, so that a second Hall voltage can be accessed at the terminals 151, 152, and so on. It is understood that the example implementations of the present disclosure can also be operated with other signal sources that can be combined with amplifiers.

On the output side of the modulator circuit 110, the amplifier circuit 100 further comprises an amplifier 120 that comprises an inverting input 121 and a non-inverting input 122 for the AC input voltage (Hall voltage, for example). The inputs 121, 122 can also be referred to as the negative and positive inputs, and constitute a differential input. The amplifier 120 also comprises an inverting output 123 and a non-inverting output 124 for an amplified AC measuring voltage. The outputs 123, 124 can in a similar way be referred to as the negative and positive output, and form a differential output. The amplifier 120 can, for example, be an operational amplifier. Other common implementations of amplifiers are also, however, conceivable.

An inverting output of the modulator circuit 110 is connected directly (e.g. without an intermediate capacitor) to the inverting input 121 of the amplifier 120, and a non-inverting output of the modulator circuit 110 is directly connected to the non-inverting input 122 of the amplifier 120. A non-inverting input of the modulator circuit 100 is connected directly to the signal source 150 (terminals 151, 153), and an inverting input of the modulator circuit 110 is connected directly to the signal source 150 (terminals 152, 154).

A demodulator circuit 130 clocked at the chopper frequency $f_{chop}$ is connected to the differential amplifier output 123, 124, and is configured to convert the amplified AC voltage back into an amplified DC output voltage. The inverting amplifier output 123 is coupled via a first capacitor 141 into a first signal path 142 to a first input 131 of the demodulator circuit 130. The non-inverting amplifier output 124 is coupled via a second capacitor 143 into a second signal path 144 to a second input 132 of the demodulator circuit. A discharge resistor circuit 160 coupled between the first signal path 142 and the second signal path 144 is located at the output of the two capacitors 141, 143.

The demodulator circuit 130 is configured to convert the AC voltage amplified by the amplifier 120 back into an amplified DC voltage. According to example implementations of the present disclosure, the demodulator circuit 130 is configured to couple each of the inverting and non-inverting outputs 123, 124 of the amplifier 120 capacitively (via the capacitors 141, 143) to an inverting input 181 and non-inverting input 182 of a comparator or differential output amplifier circuit 180 during different switching phases PH1, PH2. The inputs 181, 182 constitute a first differential input of the output amplifier circuit 180. In the example implementation illustrated, a first-order low-pass filter 170 is provided between the demodulator circuit 130 and the output amplifier circuit 180.

The modulator circuit 110 and the demodulator circuit 130 each comprise a plurality of switches that are opened or closed in different chopper switching phases PH1, PH2. The switches of the modulator circuit 110 and of the demodulator circuit 130 are here clocked synchronously. For example, the demodulator circuit 130 in the example implementation shown in FIG. 1 is configured to couple the non-inverting output 124 of the amplifier 120 to the non-inverting input 181 of the output amplifier circuit 180 during a first switching phase PH1. The demodulator circuit 130 of FIG. 1 is further configured to couple the inverting output 123 of the amplifier 120 to the inverting input 182 of the output amplifier circuit 180 during the first switching phase PH1. The demodulator circuit 130 is further configured to couple the non-inverting output 124 of the amplifier 120 to the inverting input 182 of the output amplifier circuit 180 during a second switching phase PH2. The demodulator circuit 130 is further configured to couple the inverting output 123 of the amplifier 120 to the non-inverting input 182 of the output amplifier circuit 180 during the second switching phase PH2.

The discharge resistor circuit 160 in the example implementation shown in FIG. 1, comprises a first discharge resistor 162 coupled between an output terminal of the first capacitor 141 and a reference potential 161. The discharge resistor circuit 160 further comprises a second discharge resistor 163 coupled between an output terminal of the second capacitor 143 and the reference potential 161. The input terminal of the first capacitor 141 is coupled to the inverting amplifier output 123. The input terminal of the second capacitor 143 is coupled to the non-inverting amplifier output 124. The discharge resistor circuit 160 further comprises a switch arrangement 164 that is configured to connect the first discharge resistor 162 between the first capacitor 141 and the reference potential 161, and to connect the second discharge resistor 163 between the second capacitor 143 and the reference potential 161, during at least one discharge time period.

The reference potential 161 can, for example, be a common mode potential (DC voltage), or also a ground.

Figure 2:
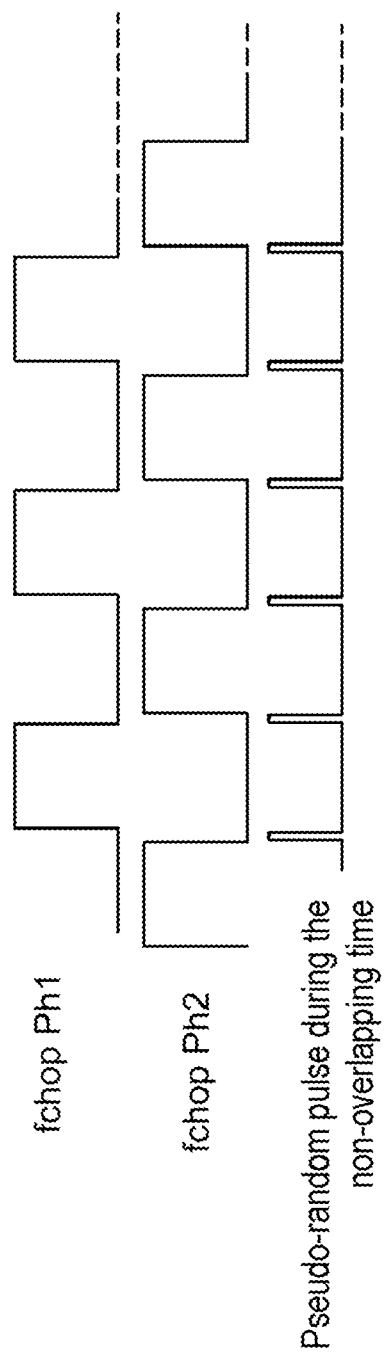

The discharge time period preferably corresponds to a time period between the first switching phase (chopper phase) PH1 and the second switching phase PH2 of the modulator circuit 110 or of the demodulator circuit 130. The two switching phases PH1 and PH2 do not overlap in time. This is shown schematically in FIG. 2. The two discharge resistors 162, 163 are thus connected using the switch arrangement 164 to the reference potential 161 after the switching phase PH1 has ended and before the switching phase PH2 has started. The discharge resistors 162, 163, are free running during the switching phases PH1 and PH2, e.g. are not connected to the reference potential 161. According to some example implementations, a duty cycle of the switch arrangement 164 can lie in the range between 0.1%-5%. According to some example implementations, the switches of the switch arrangement 164 are closed outside of the switching phases PH1 and PH2 during a time period between the two switching phases PH1 and PH2. The switches of the switch arrangement 164 are open during the switching phases PH1 and PH2. The switching times of the switch arrangement 164 can, for example, also occur at the chopper frequency. In some example implementations, the clock rate of the switch arrangement 164 can, however, also be chosen to be pseudo-random. The switching times of switch arrangement 164 are thus arranged in any case in intermediate time periods between two sequential switching phases PH1 and PH2, but not necessarily in each of these intermediate time periods.

Due to the capacitive coupling of the amplifier outputs 123, 124 to the inputs of the demodulator circuit 130 and the discharge resistor circuit 160, the DC component of a differential voltage between the non-inverting and inverting signal paths 144, 142 can be reduced, and thereby also the chopper ripple. A low-pass filter circuit 170 with an order less than or equal to three (first order in this case) coupled at the output side to the demodulator circuit 130 is thus sufficient.

It has been found to be advantageous for the discharge resistors 162, 163 to have relatively high resistances (for example in the range from 1 MΩ), so that long discharge times result. The clocked operation of the discharge resistors 162, 163 brought about by the switch arrangement 164 has the effect that the resistors 162, 163 effectively have an even greater or higher-resistance value.

Figure 3A:
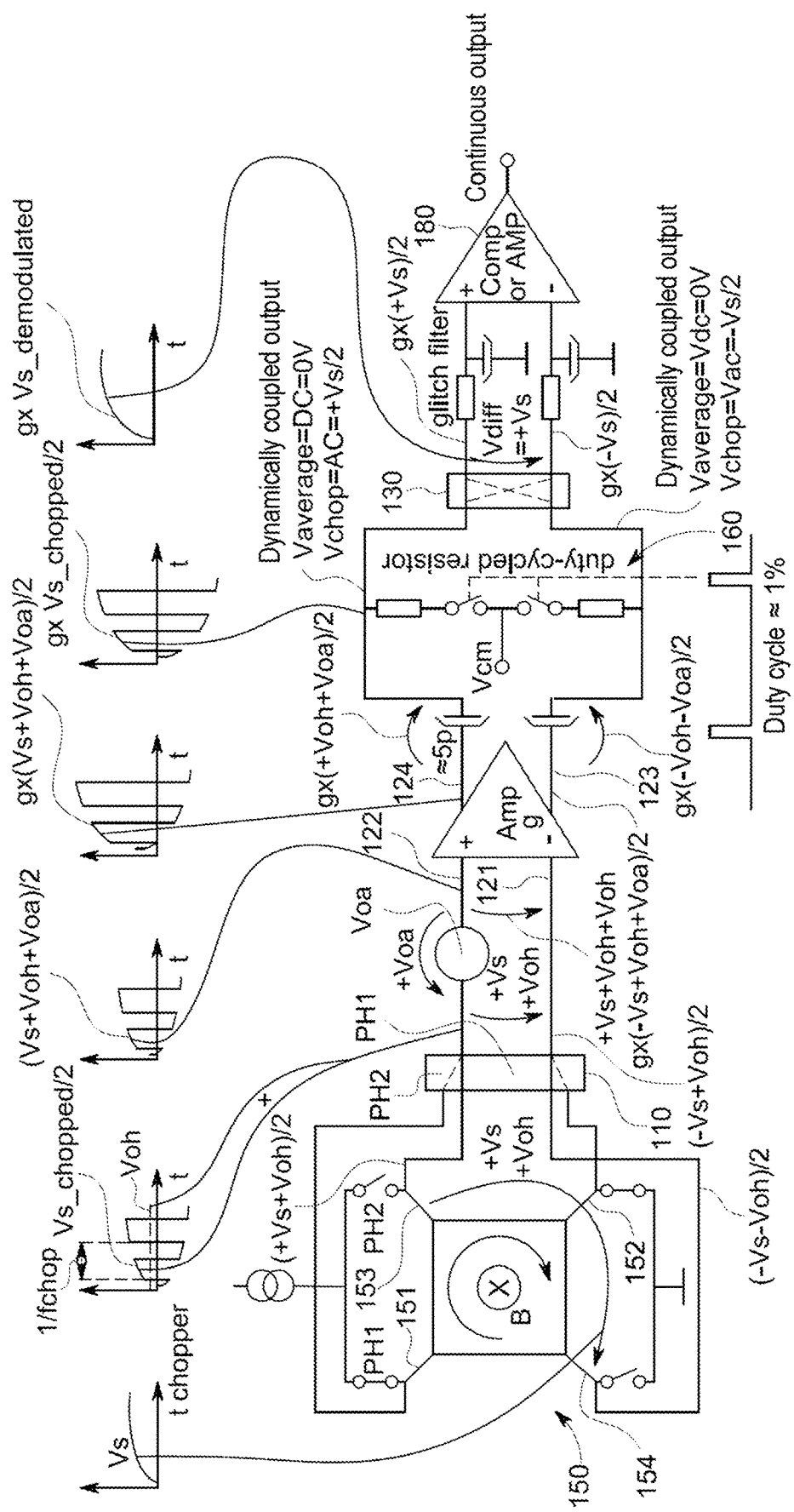
FIG. 3A shows a curve of the signal in the amplifier according to FIG. 1 in a first chopper switching phase.

The signal waveform during the two sequential switching phases PH1, PH2 during the normal mode of the amplifier circuit 100 is described below with reference to FIGS. 3A and 3B. FIG. 3A relates to the first switching phase PH1.

During the first switching phase PH1 a first current flows in the Hall sensor 150 via the terminals 151, 152, so that a first (DC) Hall voltage (+Vs+Voh)/2 can be accessed at the terminal 153 and (−Vs−Voh)/2 at the terminal 154. Due to an additional offset voltage +Voh of the Hall sensor 150 and an offset voltage +Voa of the amplifier 120, a differential input voltage of +Vs+Voh+Voa results at the differential input 121, 122 of the amplifier 120 in the first switching phase PH1. With an amplification factor g of the amplifier 120, an output voltage of g×(+Vs+Voh+Voa)/2 results at its non-inverting output 124, and an output voltage of g×(−Vs−Voh−Voa)/2 at its inverting output 123. The capacitors 141, 142 block the DC signal components g×(Voh+Voa)/2 and g×(−Voh−Voa)/2, but allow AC signal components g×(Vs)/2 and g×(−Vs)/2 through to the output amplifier circuit 180. Essentially, the amplified and offset-free Hall voltage g×Vs is obtained at the output 183 of the output amplifier circuit 180. In the normal mode, during the discharge time period, between the first switching phase PH1 and a subsequent second switching phase PH2, electrical charges corresponding to the DC signal components g×(Voh+Voa)/2 and g×(−Voh−Voa)/2 can disperse via the discharge resistor circuit 160 from the capacitors 141, 142, so that a charge equalization takes place between the capacitors 141, 142.

Figure 3B:
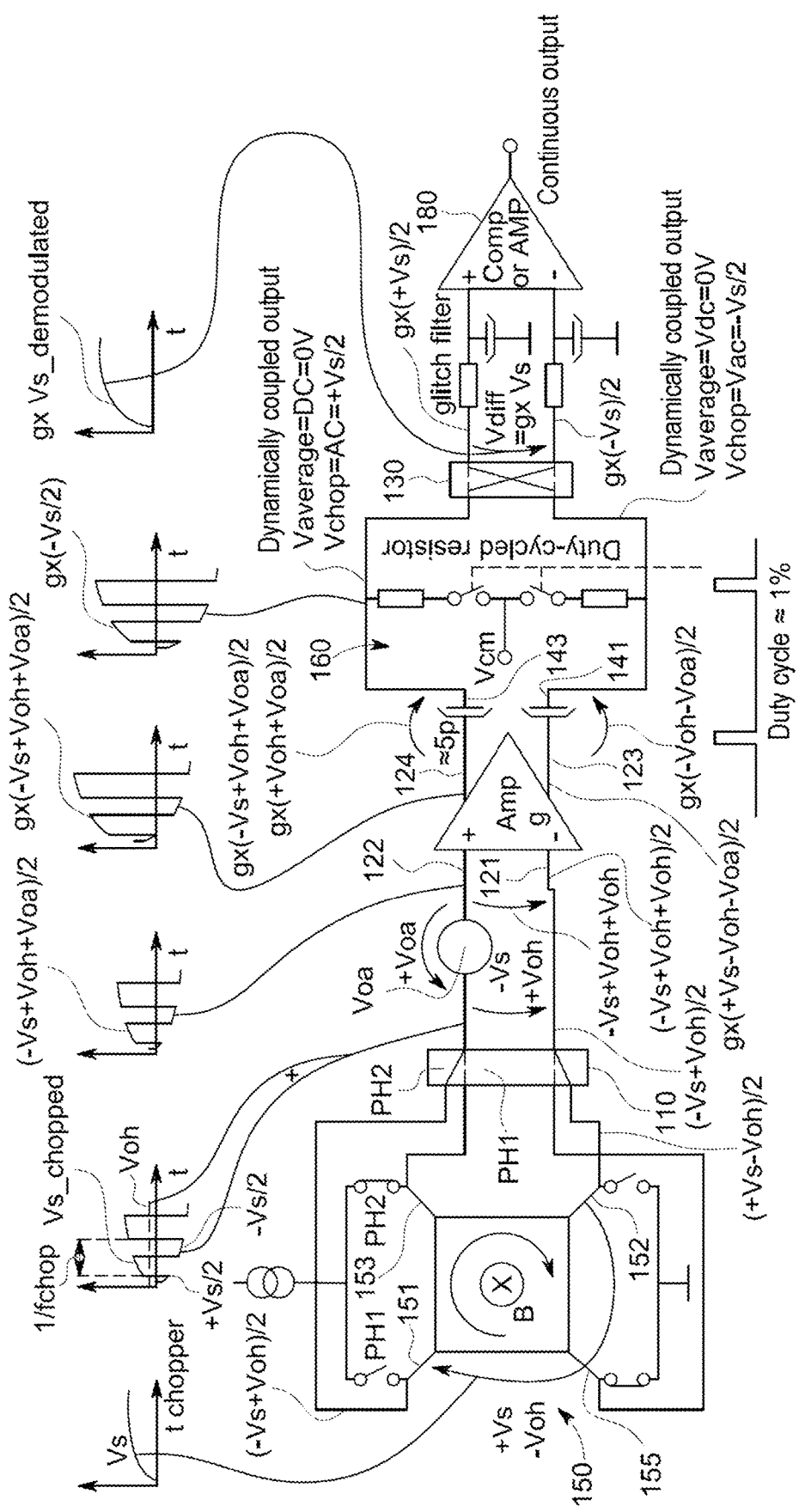
FIG. 3B shows a curve of the signal in the amplifier according to FIG. 1 in a second chopper switching phase.

FIG. 3B relates to the second switching phase PH2 in normal mode.

During the second switching phase PH2 following the first switching phase, a second current flows in the Hall sensor 150 via the terminals 153, 154, so that a second (DC) Hall voltage (−Vs+Voh)/2 can be accessed at the terminal 151 and (+Vs−Voh)/2 at the terminal 152. Due to an additional offset voltage +Voa of the amplifier 120, a differential input voltage of −Vs+Voh+Voa thus results at the differential input 121, 122 of the amplifier 120 in the second switching phase PH2. With an amplification factor g of the amplifier 120, an output voltage of g×(−Vs+Voh+Voa)/2 results at its non-inverting output 124, and an output voltage of g×(+Vs−Voh−Voa)/2 at its inverting output 123. The capacitors 141, 142 block the DC signal components g×(Voh+Voa)/2 and g×(−Voh−Voa)/2, but allow AC signal components g×(−Vs)/2 and g×(Vs)/2 through to the output amplifier circuit 180. Essentially, the amplified and offset-free Hall voltage g×Vs is obtained again at the output of the output amplifier circuit 180 by exchanging their input terminals as compared with the first switching phase PH1. During the discharge time period in the normal mode, between the first switching phase PH2 and a subsequent first switching phase PH1, electrical charges corresponding to the DC signal components g×(Voh+Voa)/2 and g×(−Voh−Voa)/2 can disperse via the discharge resistor circuit 160 from the capacitors 141, 142, so that a charge equalization takes place between the capacitors 141, 142. The chopper ripple can thereby be reduced.

Figure 4:
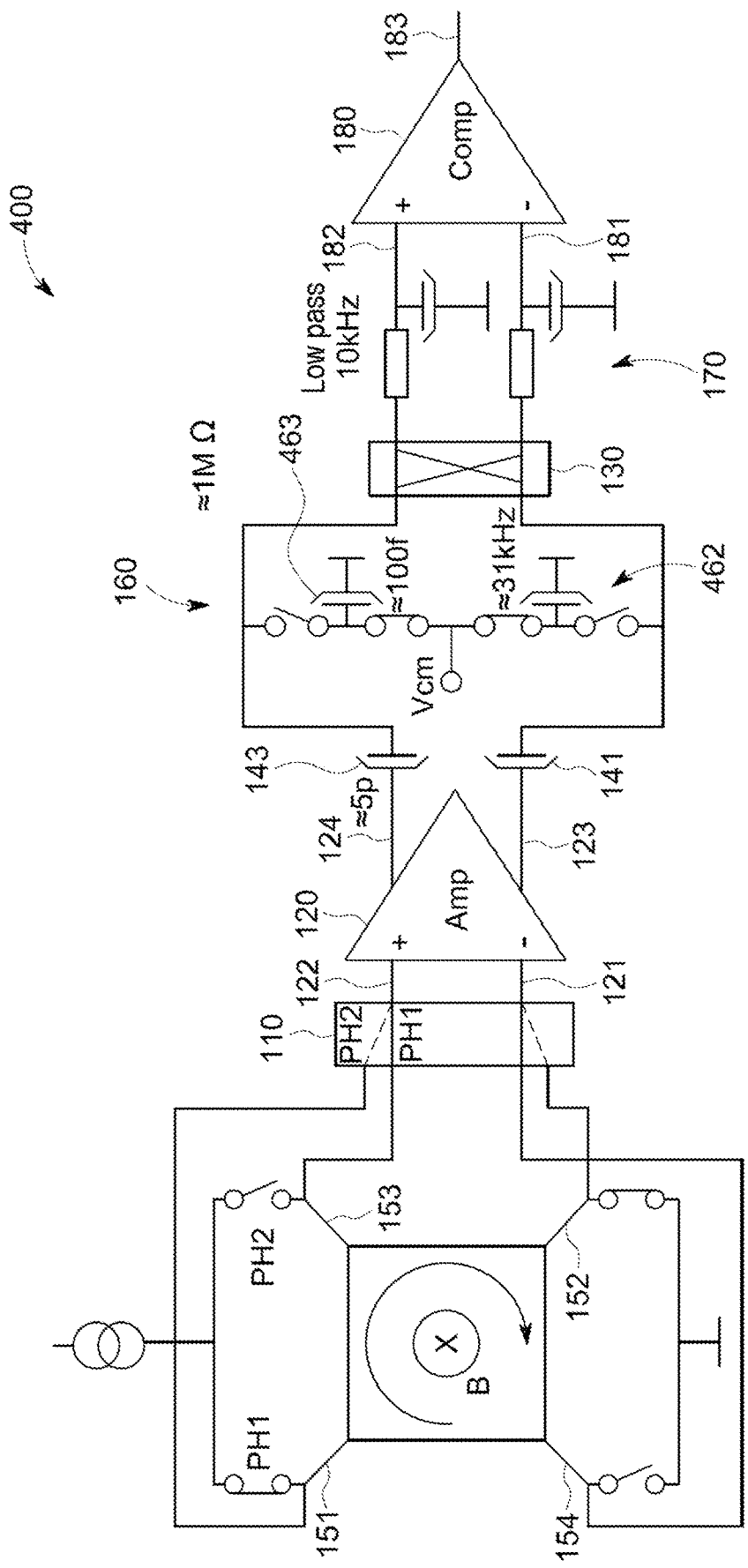
FIG. 4 shows an example implementation of an amplifier according to a further example implementation with a discharge resistor circuit configured as a switched-capacitor circuit.

When, in particular, the discharge resistors 162, 163 are implemented in integrated circuits, the realization of high-value resistors can be problematic. FIG. 4 therefore shows an example implementation of an amplifier circuit 400 in which the discharge resistors 162, 163 are realized by switched capacitors 462, 463. Switched capacitor filters, frequently also referred to by the abbreviation SC filters, are electronic filters in which ohmic resistors are replaced by switched capacitors. They are time-discrete filters. The filter parameters of the SC filters can be very easily changed by varying the switching $f_s$ with which the capacitors 462, 463 are switched over. The replacement of the ohmic resistors R in a given circuit such as a low-pass filter by capacitors Cs that are operated at the switching frequency $f_s$ can be calculated according to $R=1/f_sCs$. It will be clear to the expert that the switching $f_s$ of the capacitors 462, 463 does not have to correspond to the chopper frequency $f_{chop}$ or to the spinning frequency.

A brief, limited charge equalization, which only equalizes the temporal mean value after several (or many) chopper phases to a differential of 0 V, can take place while the chopper demodulation phases are not overlapping in time. The continuous-time signal processing (signals can also change during the chopper phases and are passed through capacitively to the output amplifier 180) that also takes place here differs from sampling switched capacitor circuits, for example, since a complete, fast charge equalization does not take place in one chopper phase. On the contrary, a charge equalization can only occur over many chopper phases, as a result of which the amplitude of the actual useful signal is essentially retained (due to negligible discharge for the useful signal within one chopper phase). The small partial discharge to a differential mean value of 0 V can be done using a small switched-capacitor circuit, which can be interpreted as, or acts as, a high-value discharge resistor. This can also be achieved using a duty-cycle resistor during the short non-overlapping phase.

Figure 5:
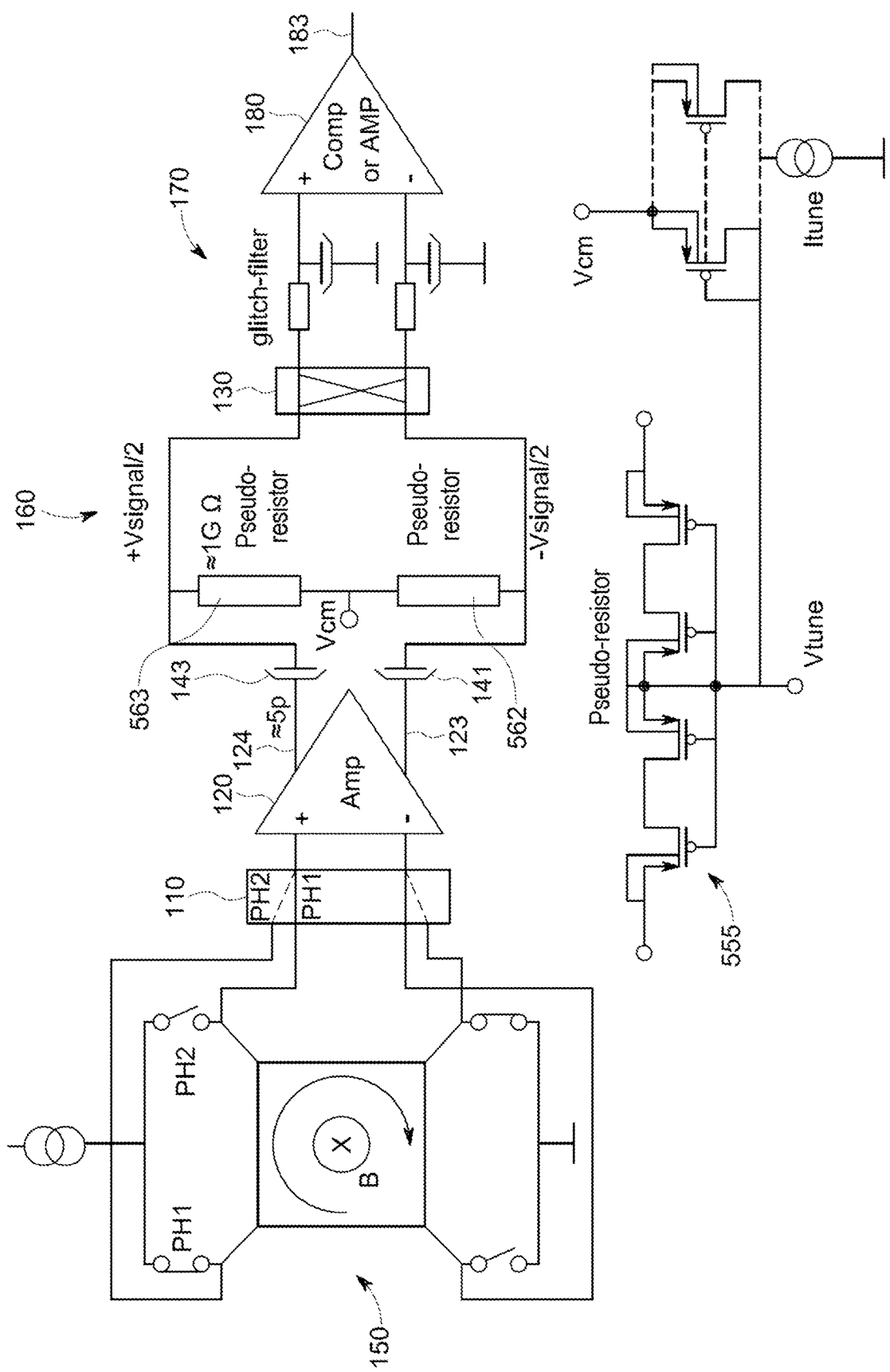
FIG. 5 shows an example implementation of an amplifier according to a further example implementation with a discharge resistor circuit configured as a pseudo-resistor circuit.

A further possibility for realizing the discharge resistors 162, 163 is shown in FIG. 5. The discharge resistors are realized there by what are known as pseudo-resistors 562, 563.

According to some example implementations, the discharge resistor circuit 160 can comprise one or a plurality of voltage-controlled pseudo-resistors 562, 563 comprising MOS transistors connected in series. Pseudo-resistors can use MOS components connected with diodes, which MOS components operate in the sub-threshold range and which use less surface area than the corresponding discrete component. As shown in the lower part of FIG. 5, one or a plurality of MOSFETs 555 biased in the sub-threshold range can function in a circuit as a linear resistor whose resistance is controlled by the gate voltage. A voltage between the terminals A and B of MOS pseudo resistors varies, for example, between −1 V and +1 V, and corresponding resistance changes for various gate voltages have been shown for various types of voltage-controlled pseudo-resistors. A possible structure of voltage-controlled PMOS pseudo-resistors is illustrated in the lower part of FIG. 5. In addition to PMOS or NMOS, complementary MOS pseudo-resistors are also conceivable.

Chopper ripple suppression can thus be achieved in combination with the spinning Hall concept, using an input modulator 110, an amplifier 120, (AC coupled) output capacitors 141, 143 connected directly between the amplifier output and the demodulator, and a duty-cycle resistor or switched-capacitor resistor or pseudo-resistor with MOS transistors operated in the sub-threshold range. An offset-compensated chopper amplifier with low chopper ripple noise, low jitter, low signal delay (latency) and low chip area can thus be provided.

The amplifier circuits 100, 400, 500 indicated above can be operated not only in a time-continuous normal mode to acquire or measure input signals (in this case the Hall voltage), but can also be operated in a time-discontinuous or time-discrete energy-saving mode in which the input signal is amplified and sampled at a defined sampling rate.

Figure 6A:
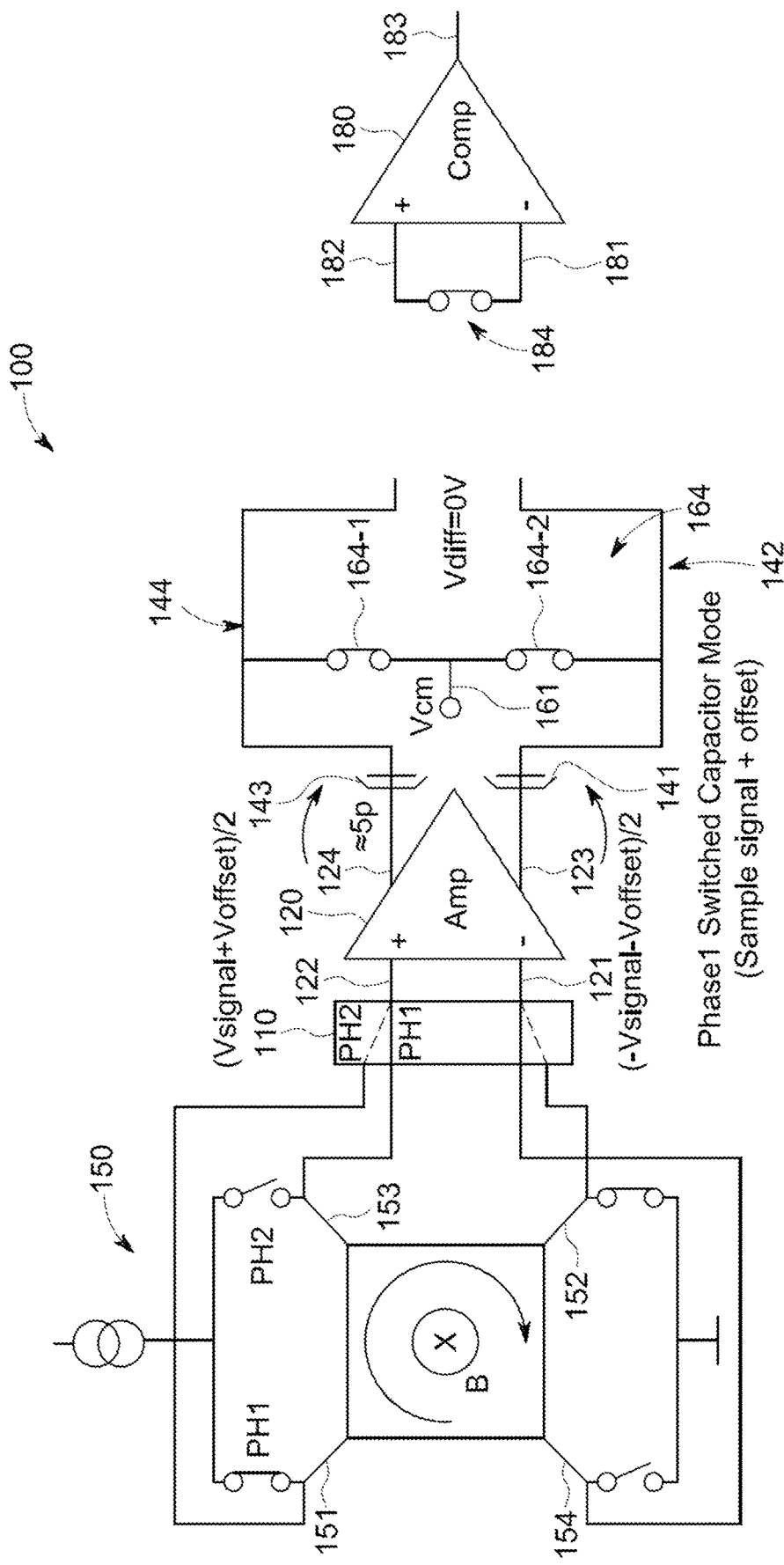
FIG. 6A shows an amplifier circuit according to one of FIG. 1, 4, or 5 in a first switching phase of a current-saving energy-saving mode.

FIG. 6A shows the amplifier circuit 100 in a first switching phase PH1 of the energy-saving mode. In contrast to the normal mode, the amplifier circuit 100 in the energy-saving mode does not comprise a discharge resistor circuit.

During the first switching phase PH1 of the modulator circuit 100 in the energy-saving mode, an output terminal of the first capacitor 141 of the inverting amplifier output 123, and an output terminal of the second capacitor 143 of the non-inverting amplifier output 124 are connected to the common DC potential 161. The switches 164-1, 164-2 of the switch arrangement 164 are closed for this purpose. In comparison with the normal mode, the output terminals of the capacitors 141, 143 are connected directly to the DC potential 161 during the first switching phase PH1 of the energy-saving mode. The discharge resistor circuit is omitted, or its discharge resistors are short-circuited, in the energy-saving mode, so that a differential voltage Vdiff between the signal paths 142, 144, or between the output terminals of the capacitors 141, 143 is 0 V.

As can be seen in FIG. 6A, the output terminals of the first and second capacitors 141, 143 are disconnected from the inputs 181, 182 of the output amplifier 180 in the first switching phase PH1 of the energy-saving mode. The inputs 181, 182 of the output amplifier 180 can also be short-circuited using a switch 184 provided between the inputs 181, 182, so that there is no output signal from the output amplifier 180.

Figure 6B:
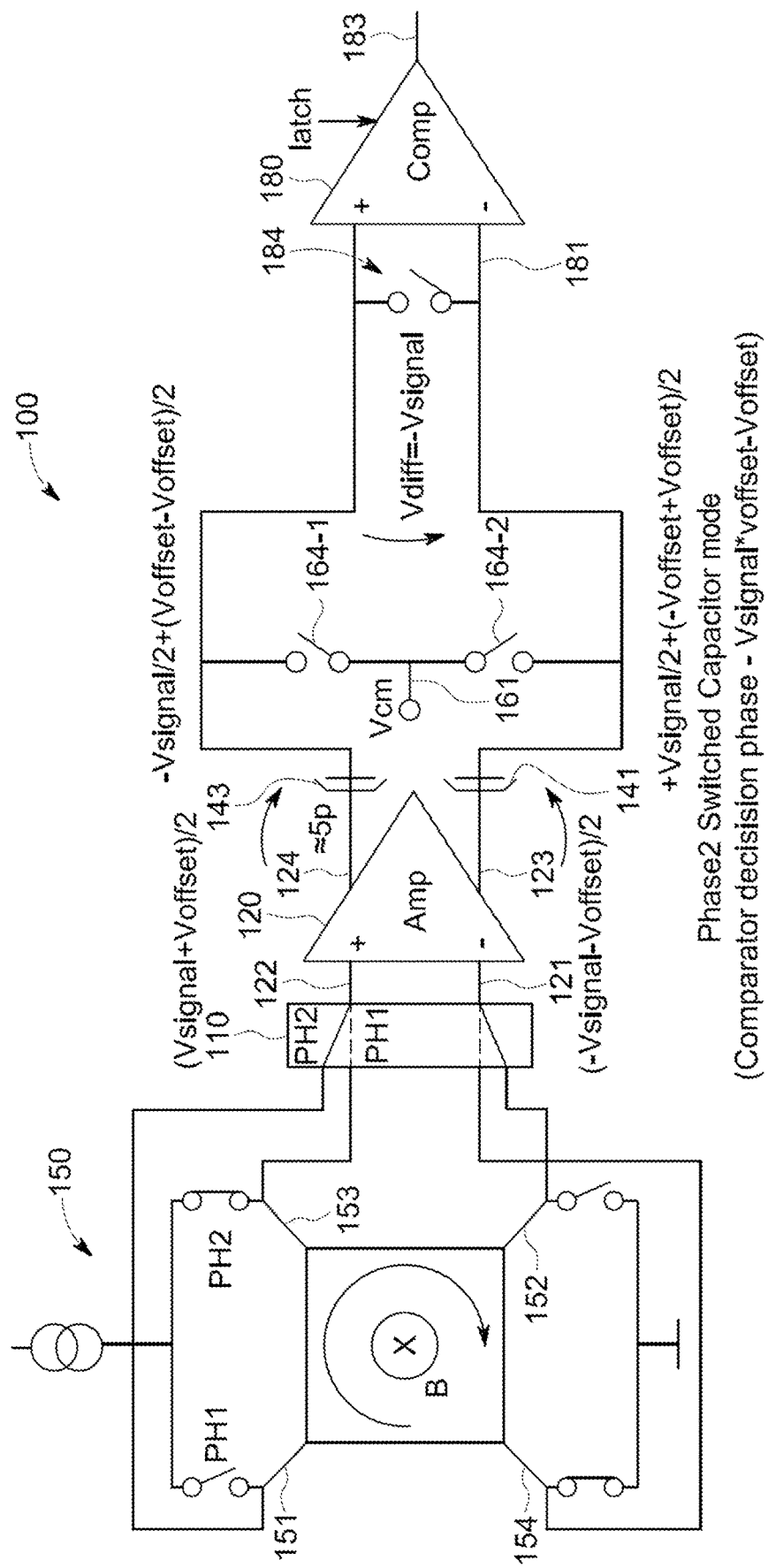
FIG. 6B shows an amplifier circuit according to one of FIG. 1, 4, or 5 in a second switching phase of a current-saving energy-saving mode.

FIG. 6B shows the amplifier circuit 100 in a second switching phase PH2 of the energy-saving mode.

While the second switching phase PH2 of the modulator circuit 100 is in the energy-saving mode, the output terminal of the first capacitor 141 is directly coupled to the input 181 of the output amplifier 180, and the output terminal of the second capacitor 143 is coupled directly to the input 182 of the output amplifier 180. The switch 184 between the amplifier inputs 181, 182 is open during the second switching phase PH2, so that the amplifier inputs 181, 182 are disconnected from one another. The switches 164-1, 164-2 of the switch arrangement 164 are also open during the second switching phase PH2, so that the output terminal of the first capacitor 141 and the output terminal of the second capacitor 143 are disconnected from the common DC potential 161, and the output terminals of the capacitors 141, 143 are disconnected from one another.

Figure 6C:
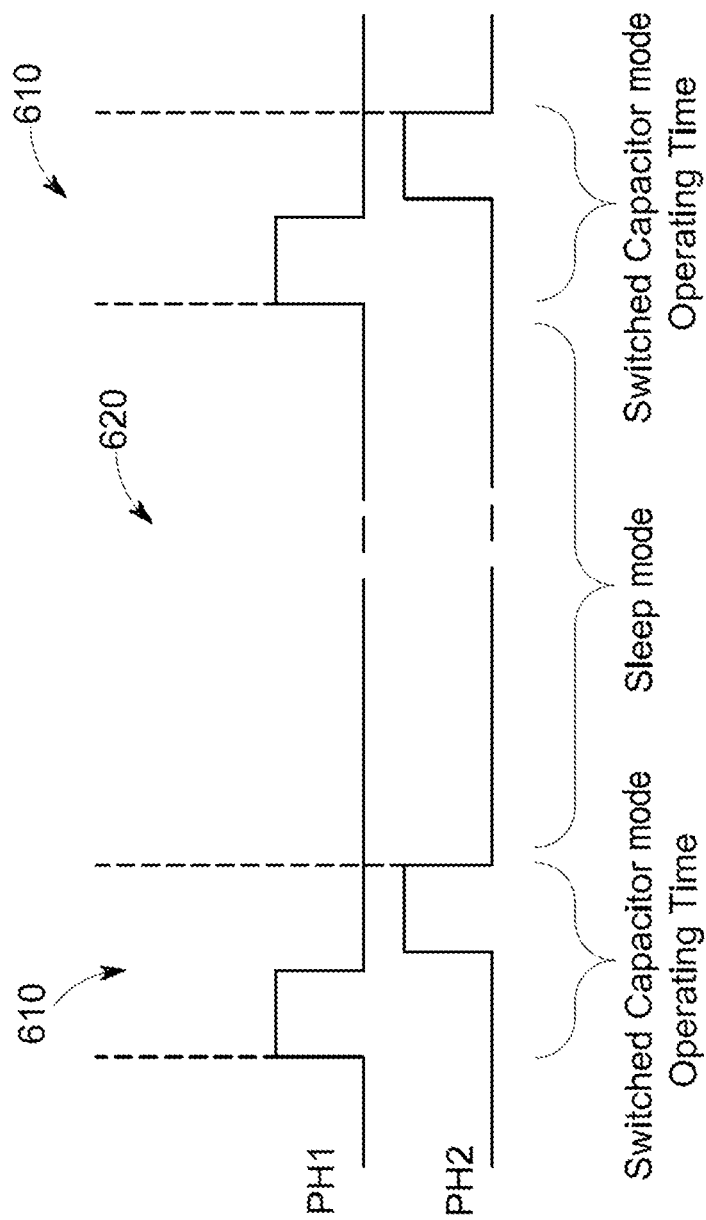
FIG. 6C shows a relationship between switching cycles and intermediate sleep time periods.

It can be seen in FIG. 6C that in the energy-saving mode, the first switching phase PH1 and an (immediately) following second switching phase PH1 form a switching cycle 610. In the switching cycle 610, the amplifier circuit 100 operates in the energy-saving mode as a sampling switched capacitor circuit. A sleep time period 620 then follows the switching cycle 610 with first and second switching phase PH1, PH2, until a further switching cycle 610 with first and second switching phase PH1, PH2 follows the sleep time period 620. A sleep time period 620 then follows again, and so on. The amplifier circuit 100 is thus configured to switch off a current consumption, at least of the amplifier circuit 120, for a sleep time period 620 in the energy-saving mode between the second switching phase PH2 of one switching cycle 610 and a first switching phase PH1 of a subsequent switching cycle 610. Current consumptions of output amplifiers 180 and/or the Hall sensor 150 can furthermore also be switched off during the sleep time period 620, in order to reduce the energy consumption of the amplifier circuits 100 further.

A ratio between the sleep time period 620 and a duration of the switching cycle (e.g. sleep time period/switching cycle) can lie in a range between 10-10,000. The sleep time period 620 can, for example, be 10 ms long, while a switching cycle 610 with switching phases PH1, PH2 can merely be 10 µs. The sleep time period 620 can thus be 10 to 1000 times longer than a switching cycle 610 with the switching phases PH1 and PH2. The greater the ratio, the lower is the energy consumption. The sampling intervals, however, also increase as a result.

Figure 7A:
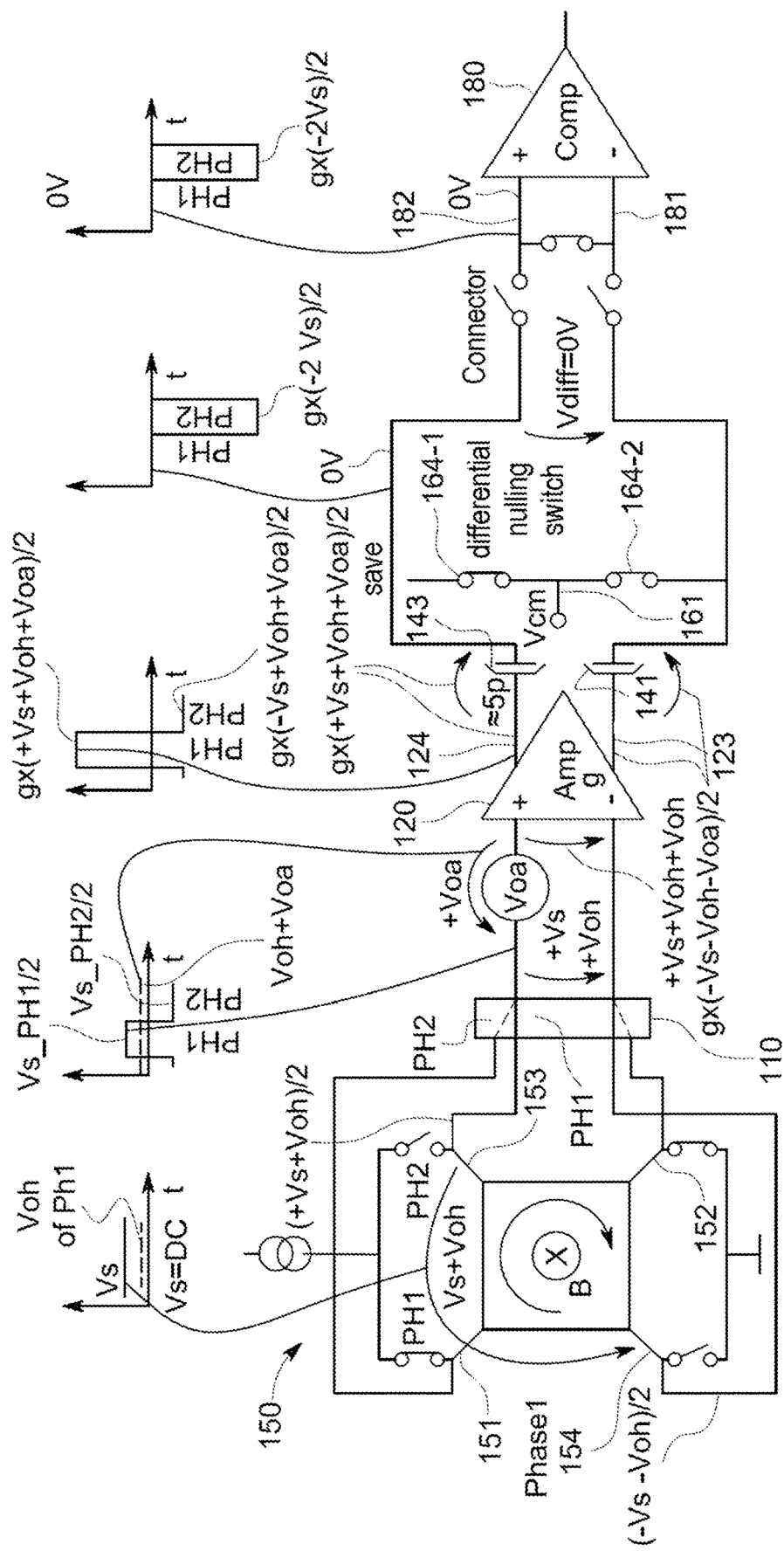
FIG. 7A shows a curve of the signal in the amplifier according to FIG. 6A in the first switching phase.

The signal waveform during the two sequential switching phases PH1, PH2 during the energy-saving mode of the amplifier circuit 100 is described below with reference to FIGS. 7A and 7B. FIG. 7A relates to the first switching phase PH1.

During the first switching phase PH1 a first current flows in the Hall sensor 150 via the terminals 151, 152, so that a first Hall voltage (+Vs+Voh)/2 can be accessed at the terminal 153 and (−Vs−Voh)/2 at the terminal 154. Due to an additional offset voltage +Voh of the Hall sensor 150 and an offset voltage +Voa of the amplifier 120, a differential input voltage of +Vs+Voh+Voa results at the differential input 121, 122 of the amplifier 120 in the first switching phase PH1. With an amplification factor g of the amplifier 120, an output voltage of g×(+Vs+Voh+Voa)/2 results at its non-inverting output 124, and an output voltage of g×(−Vs−Voh−Voa)/2 at its inverting output 123. Due to the fact that the capacitors 141, 143 are connected on the output side to the common DC potential 161 and are disconnected from the inputs 181, 182 of the output amplifier 180, the output voltages g×(+Vs+Voh+Voa)/2 (non-inverting output 124) and g×(−Vs−Voh−Voa)/2 (inverting output 124) are stored (sampled) in the capacitors 141, 143 in the first switching phase PH1.

Figure 7B:
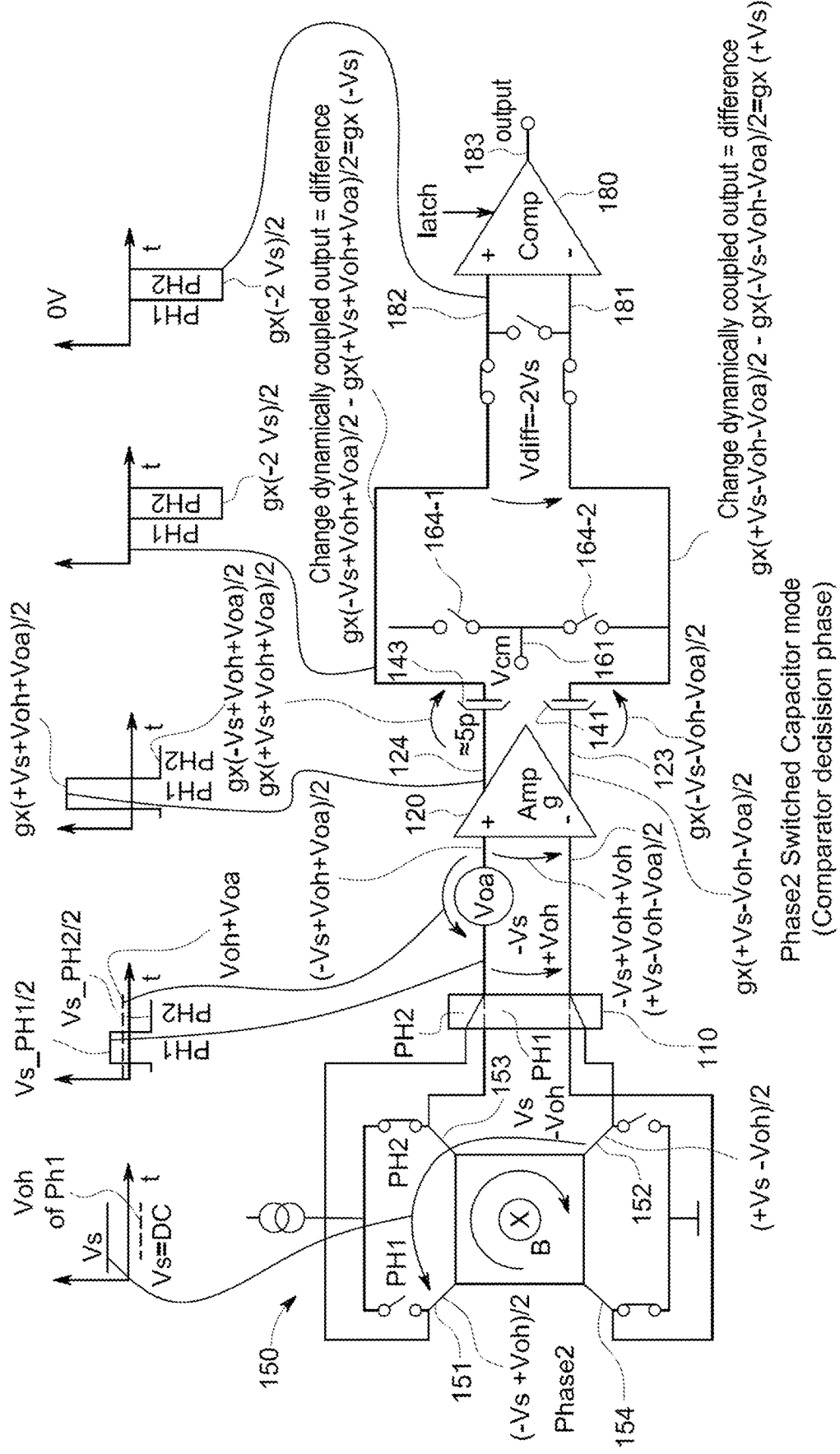
FIG. 7B shows a curve of the signal in the amplifier according to FIG. 6B in the second switching phase.

FIG. 7B relates to the second switching phase PH2 in the energy-saving mode.

During the second switching phase PH2 following the first switching phase, a second current flows in the Hall sensor 150 via the terminals 153, 154, so that a second Hall voltage (−Vs+Voh)/2 can be accessed at the terminal 151 and (+Vs−Voh)/2 at the terminal 152. Due to the additional offset voltage +Voa of the amplifier 120, a differential input voltage of −Vs−Voh+Voa results at the differential input 121, 122 of the amplifier 120 in the second switching phase PH2. With an amplification factor g of the amplifier 120, an output voltage of g×(−Vs+Voh+Voa)/2 results at its non-inverting output 124, and an output voltage of g×(+Vs−Voh−Voa)/2 at its inverting output 123. In the second switching phase PH2, the output terminal of the capacitor 143 is connected directly to the input terminal 182 of the output amplifier 180. In the same way, the output terminal of the capacitor 141 is connected directly to the input terminal 181 of the output amplifier 180. As a result of the open switches 164-1, 164-2 of the switch arrangement 164, the output terminals of the capacitors 141 and 143 are disconnected from one another and from the DC potential 161.

When changing between the first switching phase PH1 and the second switching phase PH2, a dynamically coupled output change takes place at the output terminals of the capacitors 141 and 143, so that the difference between the output voltage of the second switching phase PH2 (g×(−Vs+Voh+Voa)/2) and the (saved) output voltage of the first switching phase PH1 (g×(+Vs+Voh+Voa)/2), e.g. g×(−Vs), is present at the output terminal of the capacitor 143. Similarly, when changing between the first and second switching phases, a dynamically coupled output change takes place at the output terminal of the capacitor 141, so that the difference between the output voltage of the second switching phase PH2 (g×(+Vs+Voh+Voa)/2) and the (saved) output voltage of the first switching phase PH1 (g×(−Vs+Voh+Voa)/2), e.g. g×(+Vs), is present at the output terminal of the capacitor 143. In the second switching phase PH2 of a switching cycle in the energy-saving mode, a differential voltage of g×(−2Vs) is thus present at the differential output amplifier input 181, 182.

In the energy-saving mode, the amplifier circuit 100 can thus be operated as what is known as a correlated double-sampling switched-capacitor amplifier. Correlated double sampling is a sampling technique that also eliminates the offset. The signal +offset and signal−offset are sampled twice, and the sum then simply formed (-->double output signal). Correlated double sampling can give rise to aliasing effects, e.g. can reflect high frequency interference signals or noise signals into the useful frequency range. The susceptibility to interference and noise are thus fundamentally higher than in the case of chopping. With this technique, however, the complete and offset-free signal can be obtained in only two correlated double-sampling phases, which therefore saves a large amount of energy.

In the energy-saving mode, the amplifier circuit 100 can thus sample the (amplified) input signal (Vs) originating from the Hall sensor 150 (or another signal source) in sequential switching cycles. A comparison of sequential sample values can, for example, serve as a basis for the decision as to whether to change from the energy-saving mode into the normal mode of the amplifier circuit 100. For example, when using the Hall sensor 150 to detect rotating magnetic fields, a change in the arithmetic sign between sequential sampling values can indicate a change between magnetic half-planes or quadrants. In the energy-saving mode, the amplifier circuit 100 can thus be used as a magnetic quadrant or rotation counter. In addition or alternatively, it is possible, for example, to change from the energy-saving mode into the normal mode in response to a change in arithmetic sign between sequential sampling values, in order to measure the rotating magnetic field continuously in time. Expressed in different words, the amplifier circuit 100 can thus be configured to compare, in energy-saving mode, a first output signal of the output amplifier circuit 180 from the second switching phase PH2 of a switching cycle 610 with a second output signal of the output amplifier circuit 180 from the second switching phase PH2 of a subsequent switching cycle 610 and, in the event of a change in the arithmetic sign between the first and second output signals, to change from the energy-saving mode into the normal mode.

In some implementations, two Hall sensors are utilized for an angle sensor in order to acquire magnetic field components (cos (X) and sin (Y) components) of the rotating magnetic field that are offset by 90°. Such an angle sensor then comprises a first amplifier circuit 100, 400, 500 in accordance with the present disclosure coupled to a first Hall sensor (configured for spinning current operation). The angle sensor also comprises a second amplifier circuit 100, 400, 500 in accordance with the present disclosure coupled to a second Hall sensor (configured for spinning current operation). The first Hall sensor is sensitive to a first magnetic field direction. The second Hall sensor is sensitive to a second magnetic field direction (perpendicular to the first magnetic field direction). The first amplifier circuit is configured in the first operating mode to compare a first output signal of its output amplifier from the second switching phase of a switching cycle to a second output signal of its output amplifier from the second switching phase of a subsequent switching cycle to obtain a first comparison signal. The second amplifier circuit is configured in the first operating mode to compare a first output signal of its output amplifier from the second switching phase of a switching cycle to a second output signal of its output amplifier from the second switching phase of the subsequent switching cycle to obtain a second comparison signal. In the event that the first and/or the second comparison signal demonstrates a change in the arithmetic sign between the respective first and second output signals, the angle sensor is configured to change from the energy-saving mode into the normal mode. The change in arithmetic sign is an indicator for a change in the magnetic quadrant.

Figure 8:
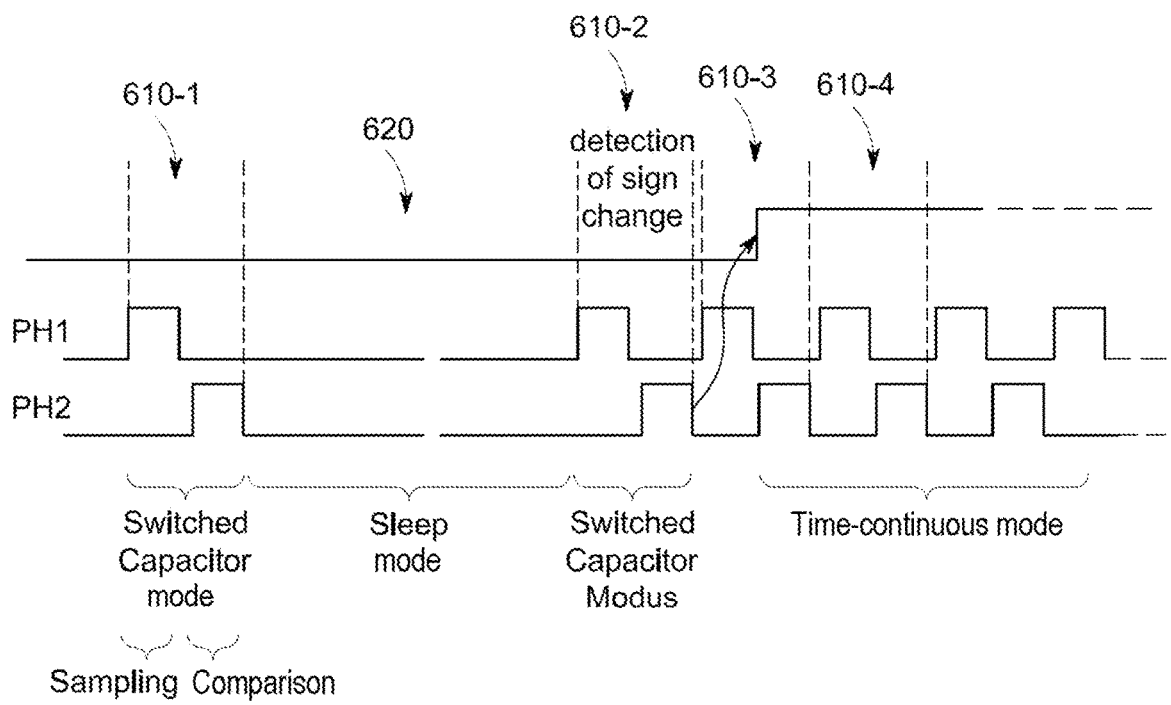
FIG. 8 shows a transition from the energy saving mode into the normal mode.

A change between the energy-saving mode and the normal mode is shown with reference to a switch diagram 800 of FIG. 8.

In the temporal sequence illustrated in FIG. 8, the amplifier circuit, or the angle sensor, is initially in the energy-saving mode. A first switching cycle 610-1, in whose switching phase PH2 a first sampling value is provided, is followed by a sleep time period 620. The sleep time period 620 is followed by a further switching cycle 610-2, in whose switching phase PH2 a second sampling value is provided. A change in the arithmetic sign is now, for example, established between the first sampling value and the second sampling value, so that the amplifier circuit changes from the energy-saving mode into the normal mode. A switching cycle 610-3, 610-4 then directly follows the switching cycle 610-2, and so on.

Figure 9:
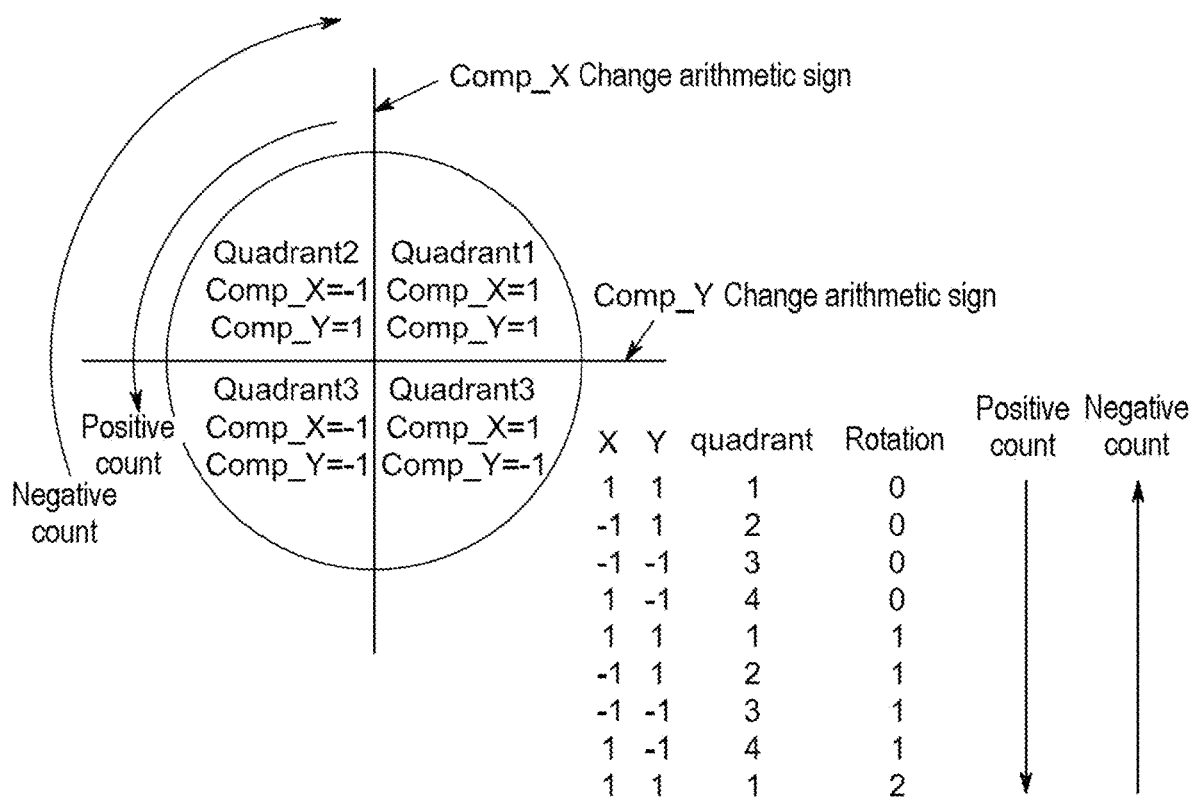
FIG. 9 shows a principle of a quadrant or rotation counter.

A mode of operation of a magnetic quadrant or rotation counter is shown in FIG. 9.

In the first quadrant (0°-90°) both the X and Y components of the rotating magnetic field are positive. On changing from the first quadrant into the second quadrant (90°-180°) the X component changes its arithmetic sign from + to − (the Y component remains +), so that, for example, the arithmetic sign of an output signal of the first amplifier circuit of the angle sensor would change from + to −. On changing from the second quadrant into the third quadrant (180°-270°) the Y component changes its arithmetic sign from + to −(the X component remains −), so that, for example, the arithmetic sign of an output signal of the second amplifier circuit of the angle sensor would change from + to −. On changing from the third quadrant into the fourth quadrant (270°-360°) the X component changes its arithmetic sign from − to + (the Y component remains −), so that, for example, the arithmetic sign of an output signal of the first amplifier circuit of the angle sensor would change from − to +. On changing from the fourth quadrant into the first quadrant the Y component changes its arithmetic sign from − to + (the X component remains +), so that, for example, the arithmetic sign of an output signal of the second amplifier circuit of the angle sensor would change from − to +. A rotation counter can be incremented simultaneously at the transition from the fourth quadrant into the first quadrant.

Some implementations described herein offer circuits with double usage combined with very low area and power. Circuits can be operated in a duty-cycled, low-power, switched-capacitor comparator mode and in a time-continuous operating mode with high-speed, low jitter, and a short latency time. Some implementations enable a conditional switching between two types of operation by recognizing a change in arithmetic sign from one sample to the next sample, or after a defined period in the time-continuous operating mode. Some implementations thus enable a self-waking and/or a wake-up signal for a microprocessor (µP).

Some implementations can thus realize a very low-current sensor with a wake-up function that is capable of providing a self-awake signal in order to change into a fast, low-jitter/low-latency mode, and to provide a wake-up signal for a sleeping µP or a system in response to signal changes. In some implementations, very low current and fast operation (of, for example, a quadrant or rotation counter) are highly in conflict. Circuits that are optimized in very different ways and that require much more surface area are usually required for each of these.

The aspects and features that are described in association with a specific one of the above implementations can also be combined with one or a plurality of the further implementations in order to replace an identical or similar feature of this further implementation, or in order to introduce the feature additionally into the further implementation.

It is furthermore to be understood that the disclosure of a plurality of steps, processes, operations or functions in the description or the claims does not necessarily have to be implemented in the sequence described, unless this is explicitly stated in individual cases or is necessarily required for technical reasons. The performance of multiple steps or functions is therefore not limited to a specific sequence by the previous description. In further examples, furthermore, a single step, a single function, a single process or a single operation may include multiple partial steps, functions, processes or operations, and/or may be decomposed into these.

If individual aspects in the preceding sections have been described in connection with an apparatus or system, these aspects are also to be understood as a description of the corresponding method. For example, a block, an apparatus or a functional aspect of the apparatus or of the system can correspond here to a feature, such as a method step, of the corresponding method. In accordance with this, aspects that are described in association with a method are also to be understood as a description of a corresponding block, a corresponding element, a property or a functional feature of a corresponding apparatus or of a corresponding system.

The following claims are hereby incorporated into the detailed description by reference, while each claim can itself stand alone as a separate example. It is furthermore to be borne in mind that—although an independent claim in the claims relates to a specific combination with one or a plurality of other claims—other examples may also comprise a combination of the dependent claim with the subject matter of any of the other dependent or independent claims. Such combinations are hereby explicitly suggested, provided it is not stated in individual cases that a specific combination is not intended. Furthermore, features of one claim should also be included for every other independent claim, even when this claim is not directly defined as dependent on that other independent claim.

The invention claimed is:

1. An amplifier circuit, comprising
a modulator circuit switchable at a chopper frequency, configured to convert an input voltage into an AC voltage at the chopper frequency;
an amplifier with an inverting input and a non-inverting input for the AC voltage, and with an inverting output and a non-inverting output for an amplified AC voltage;
wherein the inverting output of the amplifier is coupled to an input terminal of a first capacitor,
wherein the non-inverting output of the amplifier is coupled to an input terminal of a second capacitor,
wherein the amplifier circuit is configured to be operated in a first operating mode and in a second operating mode,
wherein, in a first switching phase of the modulator circuit in the first operating mode, an output terminal of the first capacitor and an output terminal of the second capacitor are connected to a common DC potential,
wherein, in a second switching phase of the modulator circuit in the first operating mode, the output terminal of the first capacitor is coupled to a first input of an output amplifier, and the output terminal of the second capacitor is coupled to a second input of the output amplifier, and
wherein, in the second operating mode, a discharge resistor circuit is coupled between the output terminal of the first capacitor and the output terminal of the second capacitor, and the output terminal of the first capacitor and the output terminal of the second capacitor are coupled to the output amplifier via a demodulator circuit switchable at the chopper frequency, wherein the demodulator circuit is configured to convert the amplified AC voltage into an amplified DC voltage.

2. The amplifier circuit as claimed in claim 1, wherein the first switching phase and the second switching phase form a switching cycle, and the amplifier circuit is configured, when in the first operating mode, to switch off a current consumption of at least the amplifier for a sleep time period between the second switching phase of a switching cycle and a first switching phase of a subsequent switching cycle.

3. The amplifier circuit as claimed in claim 2, wherein a ratio between the sleep time period and a duration of the switching cycle lies in a range between 10-10,000.

4. The amplifier circuit as claimed in claim 1, wherein the amplifier circuit is configured, when in the first operating mode, to compare a first output signal of the output amplifier from the second switching phase of a switching cycle with a second output signal of the output amplifier from the second switching phase of a subsequent switching cycle and, in the event of a change in an arithmetic sign between the first output signal and the second output signal, to one or more of: change from the first operating mode into the second operating mode or generate a wake-up signal for a microprocessor.

5. The amplifier circuit as claimed in claim 1, wherein, in the first switching phase of the modulator circuit in the first operating mode, the output terminal of the first capacitor and the output terminal of the second capacitor are disconnected from the first input of the output amplifier and the second input of the output amplifier.

6. The amplifier circuit as claimed in claim 1, wherein a resistance value of the discharge resistor circuit lies in a range such that a time constant of the first capacitor or a time constant of the second capacitor in combination with the discharge resistor circuit lies in a range from $10/f_{chop}$ to $200/f_{chop}$, wherein $f_{chop}$ indicates the chopper frequency.

7. The amplifier circuit as claimed in claim 1, wherein the discharge resistor circuit comprises:
    a first discharge resistor arrangement coupled between the output terminal of the first capacitor and a reference potential; and
    a second discharge resistor arrangement coupled between the output terminal of the second capacitor and the reference potential.

8. The amplifier circuit as claimed in claim 7, wherein the discharge resistor circuit further comprises:
    a switch arrangement that is configured to connect the first discharge resistor arrangement between the first capacitor and the reference potential, and to connect the second discharge resistor arrangement between the second capacitor and the reference potential during a discharge time period.

9. The amplifier circuit as claimed in claim 8, wherein the discharge time period corresponds to a time period between a first switching phase of the modulator circuit and a second switching phase of the modulator circuit in the second operating mode.

10. The amplifier circuit as claimed in claim 8, wherein the switch arrangement is configured to clock the switch arrangement pseudo-randomly.

11. The amplifier circuit as claimed in claim 8, wherein a duty cycle of the switch arrangement lies in a range between 0.1%— 5%.

12. The amplifier circuit as claimed in claim 1, wherein the discharge resistor circuit comprises one or more switched capacitors.

13. The amplifier circuit as claimed in claim 12, wherein a clock rate of the one or more switched capacitors is synchronous with the chopper frequency or is pseudo-random.

14. The amplifier circuit as claimed in claim 1, wherein the discharge resistor circuit comprises one or more voltage-controlled pseudo-resistors comprising switched MOS transistors connected in series.

15. The amplifier circuit as claimed in claim 1, wherein a first output of the modulator circuit is connected directly to the inverting input of the amplifier, and a second output of the modulator circuit is connected directly to the non-inverting input of the amplifier.

16. The amplifier circuit as claimed in claim 1, wherein a non-inverting input of the modulator circuit is connected directly to a signal source, and an inverting input of the modulator circuit is connected directly to the signal source.

17. The amplifier circuit as claimed in claim 1, further comprising
    a Hall sensor configured for spinning-current operation for the provision of the input voltage.

18. The amplifier circuit as claimed in claim 17, wherein the first switching phase corresponds to a first spinning phase of the Hall sensor and the second switching phase corresponds to a second spinning phase of the Hall sensor.

19. An angle sensor, comprising
    a first amplifier circuit comprising:
        a first modulator circuit switchable at a first chopper frequency, configured to convert a first input voltage into a first AC voltage at the first chopper frequency;
        a first amplifier with a first inverting input and a first non-inverting input for the first AC voltage, and with a first inverting output and a first non-inverting output for a first amplified AC voltage;
        wherein the first inverting output of the first amplifier is coupled to an input terminal of a first capacitor,
        wherein the first non-inverting output of the first amplifier is coupled to an input terminal of a second capacitor,
        wherein the first amplifier circuit is configured to be operated in a first operating mode and in a second operating mode,
        wherein, in a first switching phase of the first modulator circuit in the first operating mode, an output terminal of the first capacitor and an output terminal of the second capacitor are connected to a first common DC potential,
        wherein, in a second switching phase of the first modulator circuit in the first operating mode, the output terminal of the first capacitor is coupled to a first input of a first output amplifier, and the output terminal of the second capacitor is coupled to a second input of the first output amplifier, and
        wherein, in the second operating mode, a first discharge resistor circuit is coupled between the output terminal of the first capacitor and the output terminal of the second capacitor, and the output terminal of the first capacitor and the output terminal of the second capacitor are coupled to the first output amplifier via a first demodulator circuit switchable at the first chopper frequency, wherein the first demodulator circuit is configured to convert the first amplified AC voltage into a first amplified DC voltage;
    a second amplifier circuit comprising:
        a second modulator circuit switchable at a second chopper frequency, configured to convert a second input voltage into a second AC voltage at the second chopper frequency;
        a second amplifier with a second inverting input and a second non-inverting input for the second AC voltage, and with a second inverting output and a second non-inverting output for a second amplified AC voltage;

wherein the second inverting output of the second amplifier is coupled to an input terminal of a third capacitor, wherein the second non-inverting output of the second amplifier is coupled to an input terminal of a fourth capacitor, wherein the second amplifier circuit can be operated in the first operating mode and in the second operating mode, wherein, in a first switching phase of the second modulator circuit in the first operating mode, an output terminal of the third capacitor and an output terminal of the fourth capacitor are connected to a second common DC potential, wherein, in a second switching phase of the second modulator circuit in the first operating mode, the output terminal of the third capacitor is coupled to a first input of a second output amplifier, and the output terminal of the fourth capacitor is coupled to a second input of the second output amplifier, and wherein, in the second operating mode, a second discharge resistor circuit is coupled between the output terminal of the third capacitor and the output terminal of the fourth capacitor, and the output terminal of the third capacitor and the output terminal of the fourth capacitor are coupled to the second output amplifier via a second demodulator circuit switchable at the second chopper frequency, wherein the second demodulator circuit is configured to convert the second amplified AC voltage into a second amplified DC voltage;

a first Hall sensor configured for spinning current operation for the provision of the first input voltage for the first amplifier circuit, wherein the first Hall sensor is sensitive to a first magnetic field direction;

a second Hall sensor configured for spinning current operation for the provision of the second input voltage for the second amplifier circuit, wherein the second Hall sensor is sensitive to a second magnetic field direction;

wherein the first amplifier circuit is configured in the first operating mode to compare a first output signal of the first output amplifier from the second switching phase of a switching cycle to a second output signal of the first output amplifier from the second switching phase of a subsequent switching cycle;

wherein the second amplifier circuit is configured in the first operating mode to compare a first output signal of the second output amplifier from the second switching phase of a switching cycle to a second output signal of the second output amplifier from the second switching phase of a subsequent switching cycle;

and, in the event of a change in an arithmetic sign between the respective first and second output signals, to change from the first operating mode into the second operating mode.

20. A method for the operation of an amplifier circuit that comprises a modulator circuit switchable at a chopper frequency in order to convert an input voltage into an AC voltage in accordance with the chopper frequency, an amplifier with an inverting input and a non-inverting input for the AC voltage, and with an inverting output and a non-inverting output for an amplified AC voltage, wherein the inverting output of the amplifier is coupled to an input terminal of a first capacitor and the non-inverting output of the amplifier is coupled to an input terminal of a second capacitor, the method comprising:

in a first operating mode of the amplifier circuit:
switching an output terminal of the first capacitor and an output terminal of the second capacitor to a common DC potential during a first switching phase of the modulator circuit;
coupling the output terminal of the first capacitor to a first input of an output amplifier and coupling the output terminal of the second capacitor to a second input of the output amplifier during a second switching phase of the modulator circuit; and in a second operating mode of the amplifier circuit:
switching a discharge resistor circuit between the output terminal of the first capacitor and the output terminal of the second capacitor; and
coupling the output terminal of the first capacitor and the output terminal of the second capacitor via a demodulator circuit switchable at the chopper frequency to the output amplifier in order to convert the amplified AC voltage into an amplified DC voltage.

* * * * *